US006166619A

United States Patent [19]

Baiatu et al.

[11] Patent Number: 6,166,619

[45] Date of Patent: *Dec. 26, 2000

[54] OVERCURRENT LIMITER HAVING INDUCTIVE COMPENSATION

[75] Inventors: Tudor Baiatu, Brugg; Peter Etter, Oberehrendingen; Reinhard Fried, Nussbaumen; Hans-Jurg Wiesmann, Seegraben, all of Switzerland

[73] Assignee: DaimlerChrysler AG, Stuttgart, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/746,619

[22] Filed: Nov. 12, 1996

[30] Foreign Application Priority Data

Nov. 11, 1995 [DE] Germany .......................... 195 42 162

[51] Int. Cl.[7] ........................................ H01L 3/02

[52] U.S. Cl. .................................. 338/61; 338/9; 338/48; 338/22 R; 338/57; 338/58; 338/320

[58] Field of Search ................................. 338/314, 22 R, 338/204, 61, 49, 9, 10, 320, 260, 239, 319, 325, 322, 48, 53, 55, 58

[56] References Cited

U.S. PATENT DOCUMENTS

| | | | |
|---|---|---|---|
| 1,146,592 | 7/1915 | Northrup . | |
| 1,972,720 | 9/1934 | Tarpley et al. | 338/61 |
| 2,213,887 | 9/1940 | Ross et al. . | |
| 2,599,550 | 6/1952 | Fraser | 324/252 |
| 2,647,978 | 8/1953 | Dyer et al. . | |

(List continued on next page.)

FOREIGN PATENT DOCUMENTS

| | | | |
|---|---|---|---|
| 0548606 A2 | 6/1993 | European Pat. Off. . | |
| 626 733 | 11/1994 | European Pat. Off. . | |
| 257729 | 11/1911 | Germany . | |
| 42 25 724A1 | 7/1993 | Germany . | |
| 13701 | 1/1989 | Japan | 338/61 |
| 581 377 | 10/1976 | Switzerland . | |
| 126168 | 4/1959 | U.S.S.R. | 338/61 |

OTHER PUBLICATIONS

Flow–through and flow–by porous electrodes of nickel foam. I. Material characterization, S. Langlois et al., Journal of Applied Electrochemistry, 19 (1989), pp. 43–50.

Flow–through and flow–by porous electrodes of nickel foam. IV. experimental electrode potential distributions in the flow–through and in the flow–by configurations, S. Langlois et al., Journal of Applied Electrochemistry, 20 (1990), pp. 749–755.

(List continued on next page.)

*Primary Examiner*—Karl D. Easthom
*Attorney, Agent, or Firm*—Burns, Doane, Swecker & Mathis, L.L.P.

[57] ABSTRACT

Current limiters, preferably PTC resistors, are used for limiting short-circuit current when connected in series to capacitors and converter valves. Protective devices operating with these PTC resistors are able to work reversibly and respond without arcing. They have a low inductance and can be used in space-saving designs. Protective circuits with such PTC resistors have a low loss, are shake-proof, and can be integrated into an existing cooling circuit. They respond autonomously and enable a flexible application. The PTC resistors preferably are constructed in a meander shape of porous metal foam or a metal braid or fabric and have electrical contact bridges between their resistor tracks. At least 2 resistor tracks that are electrically connected in parallel are arranged at a small distance on top of each other in such a way that partial currents (I1, I2) flow in opposite directions through resistor branches in superposed track areas formed in this manner. The resistor tracks can also be arranged in grooves of a cooling body or may have a circular shape. A compensation resistor for compensating uncompensated marginal areas of these resistor tracks can be provided in serial connection to meander-shaped, parallel connected resistor tracks.

10 Claims, 3 Drawing Sheets

U.S. PATENT DOCUMENTS

| | | | |
|---|---|---|---|
| 2,945,180 | 7/1960 | Parker | 324/126 |
| 3,843,950 | 10/1974 | Schladitz | 338/208 |
| 3,878,501 | 4/1975 | Moorhead et al. | 338/23 |
| 4,420,739 | 12/1983 | Herren | 338/53 |
| 4,434,417 | 2/1984 | Beriger et al. | 338/53 |
| 4,533,821 | 8/1985 | Sato | 219/545 |
| 4,568,907 | 2/1986 | Hurtle | 338/61 |
| 4,795,998 | 1/1989 | Dunbar et al. | 338/5 |
| 4,908,497 | 3/1990 | Hjortsberg | 219/539 |
| 4,994,932 | 2/1991 | Okamoto et al. | 361/19 |
| 5,142,265 | 8/1992 | Motoyoshi et al. | 338/22 R |
| 5,313,184 | 5/1994 | Greuter et al. . | |
| 5,353,005 | 10/1994 | Salanki | 338/55 |
| 5,406,246 | 4/1995 | Friese et al. | 338/22 R |
| 5,614,881 | 3/1997 | Duggal et al. | 338/22 R |

OTHER PUBLICATIONS

*Elektrotechnik,* Band 3, Bauelemente und Bausteine der Informationstechnik, Editor Prof. Dr. E. Phillipow, 1st edition, VEB Verlag Technik, Berlin, 1978, p. 250. (No Month).

*Taschenbuch Elektronik* [Electronics Handbook], vol. 3, pp. 252–255 Phillopow, Dr. E., (no translation).

OVERCURRENT LIMITER HAVING INDUCTIVE COMPENSATION

FIELD OF THE INVENTION

The invention relates to overcurrent limiters, and more particularly to overcurrent limiters of the type having a plurality of resistor branches.

BACKGROUND OF THE INVENTION

Prior art includes Swiss Patent 581 377. There, an overcurrent limiter or a PTC resistor component is disclosed, in which 3 PTC resistors with different dimensions and that are made from sintered bodies may be connected in parallel with one another and respond to each other consecutively when a short-circuit current occurs. These PTC resistors may also be connected in parallel to one another with a fixed resistor and a switch. Such overcurrent limiters are able to reversibly limit short-circuit currents to values below the limit that is destructive for the active components, for example converters. During a malfunction, the PTC resistor is heated to a temperature above its response temperature and limits the short-circuit current to values that are non-damaging for the current circuit. The thermal destruction of the PTC resistor is prevented by commutating the short-circuit current to the parallel resistor.

It would be desirable for the converter operation that the intermediate circuit inductance during nominal operation be distinctly reduced. In the case of a short circuit however, the expected short-circuit current amplitudes rise to values that currently cannot be controlled in traction systems. Since the required reaction times of the protective device are in the $\mu$s range, a current limiter is indispensable. But the intrinsic inductance of the known current limiter is too high. Intrinsic inductance values in the nH range are required.

Regarding the relevant prior art, reference is made to EP 0 548 606 A2 which specifies an overcurrent limiter that has a varistor connected in parallel with a PTC resistor and that may be combined with the PTC resistor in one component.

The softcover book Elektrotechnik, Band 3, Bauelemente und Bausteine der Informationstechnik, Editor Prof. Dr. E. Phillipow, 1st edition, VEB Verlag Technik, Berlin, 1978, p. 250 describes winding designs for low-inductance resistors, e.g. the bifilar winding, the Chaperon winding, and the meander shape.

It is known from U.S. Pat. No. 1,146,592, for producing precision resistors for Wheatstone bridges, to arrange at least two low-inductance, bifilar or spiral standard resistors in parallel connected, electrically insulated resistor branches in identical track areas on top of one another. Partial currents then flow through these resistors branches in opposite directions, so that inductive effects of the resistor tracks connected parallel to one another compensate for one another. This kind of precision resistor is unsuitable as an overcurrent limiter. No further details are provided as to the distance between the resistor tracks connected parallel to one another.

SUMMARY OF THE INVENTION

It is an object of this invention to provide a current limiter also known as a overcurrent limiter of the initially mentioned type that exhibits a lower inductance.

The current limiter of this invention has at least 2 resistor branches connected parallel to each other, whereby each of these resistor branches contains at least one resistor, resistors of 2 parallel connected resistor branches each carry during operation at least approximately equal partial currents (I1, I2), the resistors in these parallel connected resistor branches have low-inductance resistor tracks which are electrically insulated from each other and are arranged with identical track areas on top of each other in such way that partial currents (I1, I2) flow through these resistor branches in superposed track areas in opposite directions to each other.

One advantage of the current limiter of this invention is that protective devices operated with these PTC resistors work reversibly, respond without arcing, and can be used with low inductance and in a space-saving design. The protective circuits have a low loss, are shake-proof, and can be integrated into an existing cooling circuit. They respond autonomously and enable a flexible application. The protective system's reliability is not negatively affected by additional electronic assemblies and components.

If the current limiters are used connected in series as power converter valves, no current limiting reactor must be used.

According to an advantageous design of the invention, no fluid cooling is necessary.

BRIEF DESCRIPTION OF THE DRAWINGS

A preferred embodiment of the invention is described herein and illustrated in the accompanying drawings, in which identical parts have been designated with the same reference symbols.

DESCRIPTION OF THE INVENTION

Figure 1:
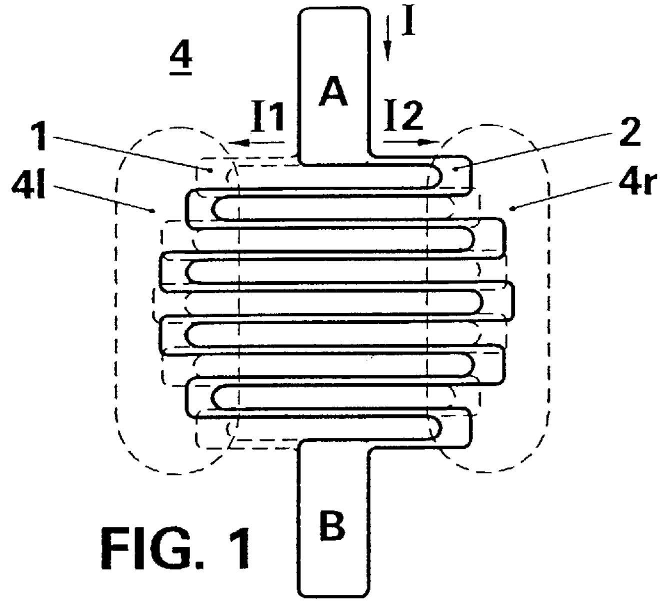
FIG. 1 is a plan view of a current limiter of PTC resistors arranged in an insulated manner, connected in parallel electrically, which have meander-shaped resistor tracks.

FIG. 1, in the form of a top view 2, shows meander-shaped PTC resistors 1, 2 that are connected electrically parallel to each other and are electrically insulated from each other and are located at a small distance (a) in the range from 0.01 mm–1 mm, preferably 0.01 mm to 0.8 mm from each other (see FIG. 6) with mutual electrical connections A, B (see FIG. 5) at the ends. Organic and inorganic insulation layers can be used to galvanically separate the PTC resistors 1, 2. In the case of unilateral cooling (not shown), the insulation layer should also be thermally conductive. Such an insulation layer may, for example, be a foil on a duromer, thermoplast or elastomer basis, filled with inorganic, thermally conductive particles, for example of AlN, $Al_2O_3$, or BN.

Figure 2:
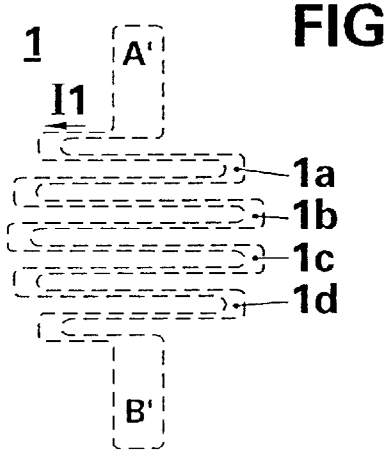
FIGS. 2 and 3 are modified views of the PTC resistor of FIG. 1.
Figure 3:
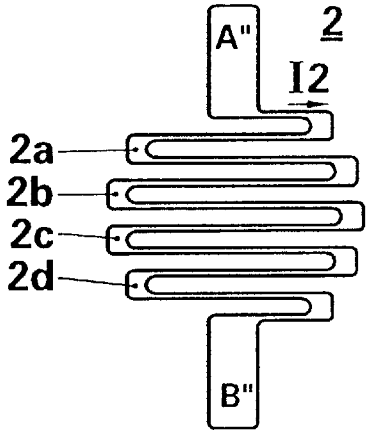

The PTC resistor 1 with electrical connections A', B' at its ends and with meanders 1*a*–1*d* is shown with broken lines in FIG. 2, and the PTC resistor 2 with electrical connections A", B" at its ends and meanders 2*a*–2*d* is drawn with solid lines in FIG. 3. The two electrical connections A' and A" together form connection A, and the two electrical connections B' and B" together form connection B. The two identically shaped PTC resistors 1, 2 are arranged with resistor tracks laterally reversed on top of each other at a which corresponds to a shift in a direction perpendicular to the planes in which the two PTC resistors are arranged distance (a).

The PTC resistors 1, 2 consist of a structured foil or a layer created with a chemical or electrochemical process from a preferably ferromagnetic metal or metal alloy. Especially suitable are materials based on nickel, iron, or cobalt and their alloys. The positive temperature coefficient of the specific resistor of these materials, which is particularly high in comparison to non-ferromagnetic pure metals, exhibits a non-linear behavior that is advantageous for the application, with a maximum near the Curie temperature. In principle, even non-ferromagnetic metals, such as beryllium or ruthenium, can be used with a temperature coefficient of the resistor of $>4 \cdot 10^{-3}$ $K^{-1}$.

The necessary dynamic response behavior of the PTC resistors 1, 2 under short-circuit conditions is achieved by designing the active part with a small cross-section area. Typical values of the cross-section area for a circuit according to FIG. 1 are in the range from 0.1 $mm^2$ to 5 $mm^2$, preferably in the range from 0.5 $mm^2$ to 1.5 $mm^2$. The PTC resistor values at room temperature range from several 10 mΩ to 100 mΩ.

One advantage of this arrangement according to FIG. 1 is the relatively low voltage load on the intermediate insulation layer, which under nominal operation is only a few volts and in the case of a short circuit is loaded briefly with no more than the intermediate circuit voltage of a direct voltage intermediate circuit of a converter (not shown here).

A total current (I) indicated in FIG. 1 by an arrow is divided in the PTC resistors 1, 2 into two partial currents I1, I2 of equal size that flow in opposite directions in the superposed meanders 1*a*–1*d* and 2*a*–2*d*, so that these PTC resistors 1, 2 that are connected parallel have a particularly low intrinsic inductance. The partial currents I1, I2 are only uncompensated in the upper and lower input and output areas, as well as in the left and right marginal areas 41, 4*r* of a current limiter 4 according to FIG. 1, resulting in a low inductance of the PTC resistors 1, 2.

Figure 5:
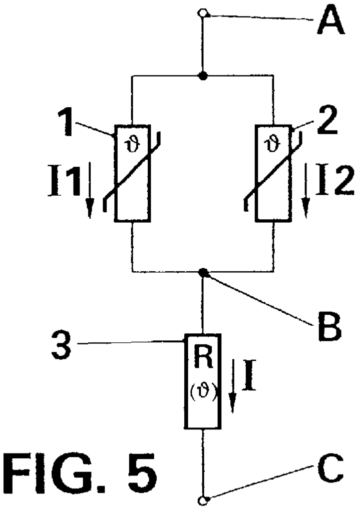
FIG. 5 is an electrical switching diagram for the connections of the resistors according to FIGS. 1–4.
Figure 6:
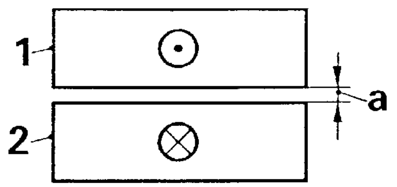
FIG. 6 is a schematic view of the layer sequence of the PTC resistors according to FIGS. 2 and 3 in the current limiter of FIG. 1.

In order to reduce this low inductance, a compensation resistor 3 of a non-linear PTC resistor material or of a metallic conductor material, e.g. of copper, is electrically connected in series with the two parallel connected PTC resistors 1, 2 (see FIG. 5).

When using a metallic conductor material as a return conductor, no forced cooling is necessary.

Figure 4:
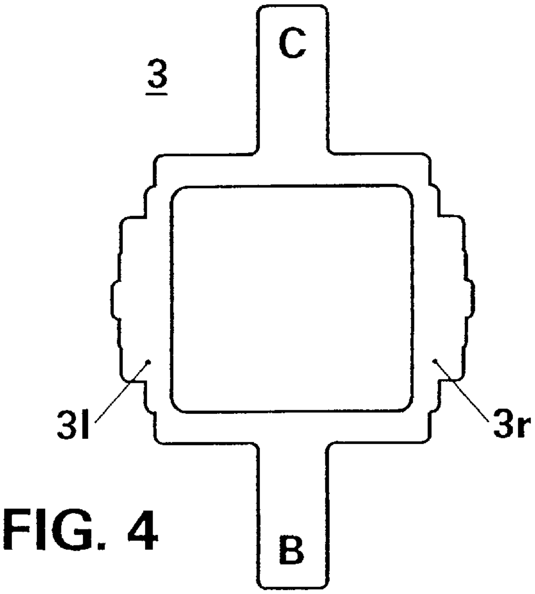
FIG. 4 is a plan view of a compensation resistor for connection in series to the current limiter according to FIG. 1.
Figure 7:
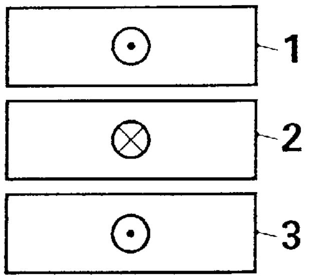
FIG. 7 is a schematic view of the layer sequence of the PTC resistors according to FIGS. 2 and 3 with the compensation resistor according to FIG. 4.

FIG. 4 shows the geometrical structure of this compensation resistor 3 with left and right compensation branches 31, 3*r*, as well as upper and lower power conductors that have the same shape as the uncompensated marginal areas 41, 4*r* of the current limiter 4 and the upper and lower resistor tracks of the PTC resistors 1, 2. This compensation resistor 3 is arranged at a small distance to the PTC resistor 2 (see the layer sequence in FIG. 7), whereby an electrical connection B is electrically connected to the connection B of the current limiter 4 according to FIG. 1, and a connection C at the end is arranged on top of connection A. This current limiter circuit according to FIG. 5 has an intrinsic inductance that is lower by a factor of 7–8 than the current limiter 4 according to FIG. 1.

Figure 8:
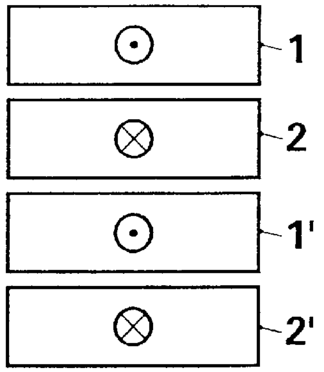
FIG. 8 is a schematic view of the layer sequence of 4 PTC resistors according to FIGS. 2 and 3, FIGS. 9–12 are plan views of different exemplary embodiments of PTC resistors.

FIG. 8 shows a quadruple layering of conductors with anti-parallel current conductance, in which in addition to the PTC resistors 1, 2 according to FIG. 1 also another pair of identically constructed PTC resistors 1', 2' are arranged on top of each other and are electrically connected parallel to the PTC resistors 1, 2. This arrangement according to FIG. 8 has half the intrinsic inductance of the arrangement according to FIG. 1 and FIG. 6.

Figure 9:
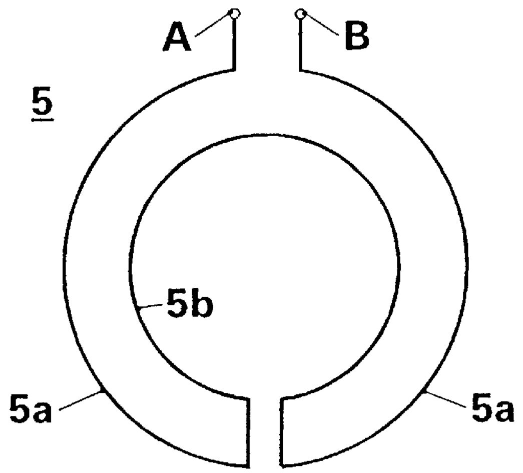
Figure 10:
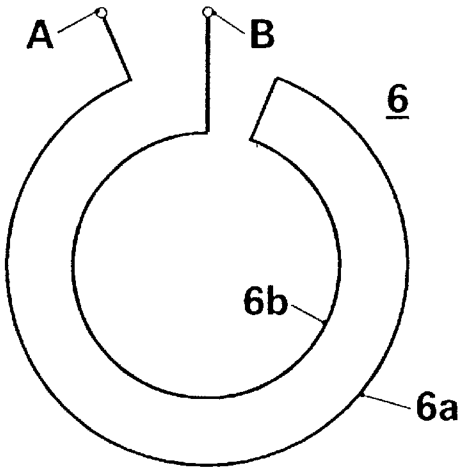

Instead of the meander-shaped PTC resistors 1, 2 according to FIGS. 2 and 3, circular conductor arrangements with a Chaperon winding 5 according to FIG. 9 or with a bifilar winding 6 according to FIG. 10 can be used, with outer branches 5*a* or 6*a* respectively and inner branches 5*b* or 6*b* respectively. The electrical connections A, B hereby can be arranged on top of each other, resulting in a lower intrinsic conductance.

Figure 11:
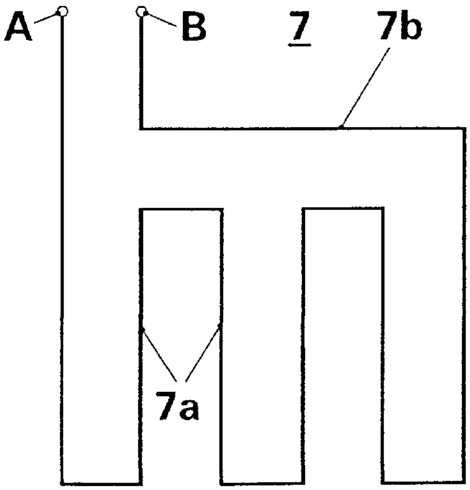
Figure 12:
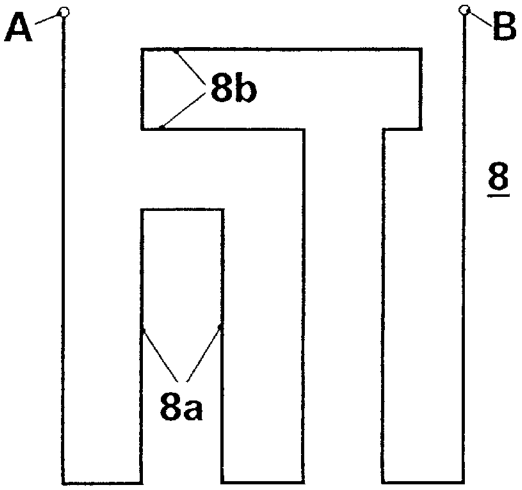

In the case of arrangements with meander-shaped resistor tracks 7 and 8 according to FIGS. 11 and 12—with meander branches 7*a* and 8*b*—marginal areas of the meander tracks are compensated by a return conductor branch 7*b* (see FIG. 11) or by a return conductor loop 8*b* (see FIG. 12). In the arrangement according to FIG. 11, the electrical connections A, B closely adjoin each other, while they are provided at the ends and have longer leakage paths in the arrangement according to FIG. 12.

Figure 13:
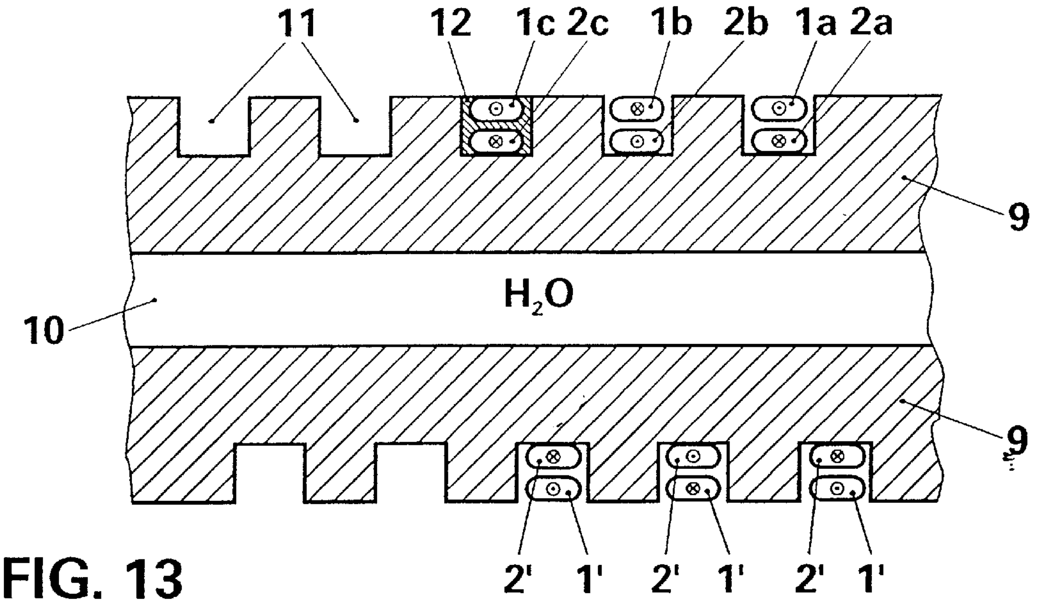
FIG. 13 is a cross-sectional view of an arrangement of PTC resistors according to FIGS. 2 and 3 in the grooves of a fluid-cooled cooling body.

FIG. 13 shows the structure of a current limiter in which the meanders 1*a*–1*c* and 2*a*–2*c* of the PTC resistors 1, 2 are inserted on top of each other into upper grooves 11 of a cooling body 9, and the meanders of the PTC resistors 1', 2' are inserted into its lower grooves 11. The cooling body 9 consists of an electrically insulating, thermally conductive ceramic material and has on its inside a cooling duct 10 for circulation cooling which contains a cooling fluid, preferably water, as a coolant.

The grooves 11 which completely hold the tracks of the PTC resistors 1, 2 are filled with an electrically insulating, thermally conductive casting compound 12. This casting compound 12 provides the necessary thermal contact between the PTC resistors 1, 2, 1', 2' and the cooling body 9. In a multilayer construction according to FIGS. 6–8, the casting compound 12 simultaneously electrically insulates the various layers of the tracks. The casting compound 12 preferably consists of a duromer, thermoplast and/or elastomer polymer matrix filled with inorganic, thermally conductive particles, such as, for example, AlN, $Al_2O_3$. Hereby a high degree of filling can be achieved by using bimodally distributed particles (with at least 2 frequency maxima of particle size).

In the design according to FIG. 13, the tracks are located at the two end faces of the cooling body 9. The tracks may be pre-laminated by thermoplast or elastomer bonding prior to being cast.

Figure 14:
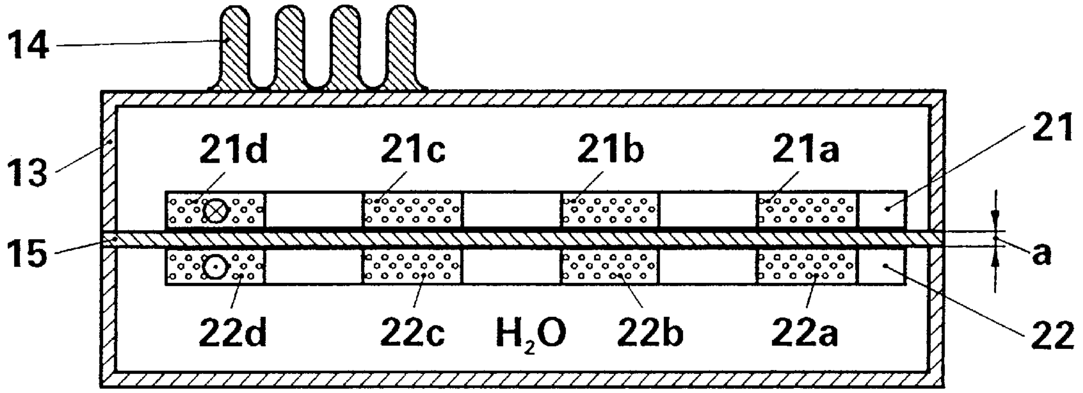
FIG. 14 is a cross-sectional view of a current limiter located in a cooling container and having 2 PTC resistors of porous metal foam.

FIG. 14 is a schematic of a cross-section of a current limiter with PTC resistors 21, 22 which have meanders 21*a*–21*d* and 22*a*–22*d* respectively, and in the superposed arrangement correspond to PTC resistors 1, 2 in FIG. 1. These PTC resistors 21, 22 consist of a highly porous foam of a preferably ferromagnetic metal or metal alloy. They are electrically insulated against each other by an electric insulation foil or resistor carrier 15 with a thickness (a) and are held in a closed cooling container 13 which may have cooling ribs 14. This cooling container 13 is filled with an electrically non-conductive fluid, for example with deionized water, which ensures sufficient cooling of the PTC resistors 21, 22 without forced circulation.

Figure 15:
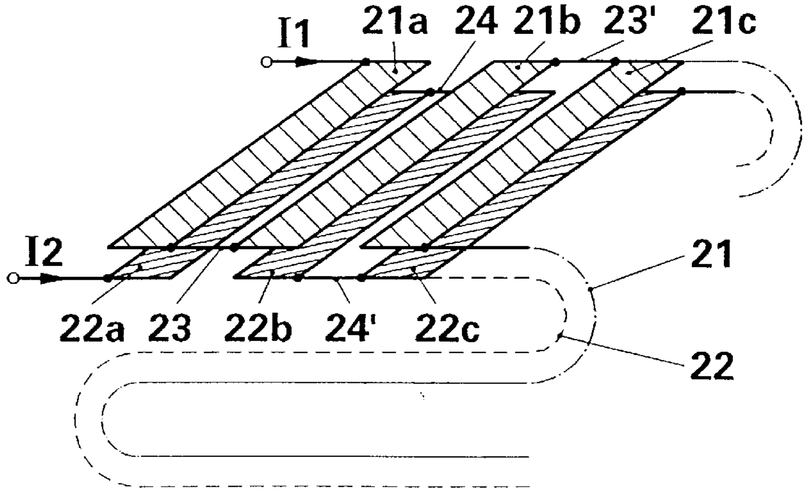
FIG. 15 is a schematic view of 2 resistor tracks with anti-parallel current conductance and electrical contact bridges between tracks of a metal braid or fabric.

FIG. 15 shows PTC resistors 21, 22 of a metal braid or fabric or foam so porous and with such a large surface that fan air cooling is sufficient to keep the PTC resistors 21, 22 at suitable operating temperatures. The meanders or resistor tracks 21*a*–21*c* of the PTC resistor 21 are connected via electrical contact bridges 23, 23', and meanders or resistor tracks 22*a*–22*c* of the PTC resistor 22 by electrical contact bridges 24, 24'. Such 2-layered tracks 21, 22 formed in such a manner may have a space-spacing, multilayer construction.

It should be understood that such 2-layered tracks 21*a*–21*c*, 22*a*–22*c* also can be folded rather than wound. The electrical feed lines are then provided at the periphery of the winding, while the corresponding power discharge lines pass from the center of the winding to the outside (not shown).

Instead of PTC resistors 1, 2, low-inductance normal resistors also can be produced with the above design.

Thus, exemplary embodiments as illustrated in FIGS. 1–15 are directed to an overcurrent limiter having at least two meandering resistor branches connected in parallel with each other, each of the resistor branches containing at least one PTC resistor. The PTC resistors in each of the two meandering resistor branches each have at least one resistor track with plural track areas, each track area adjacent a successive track area establishing a current flow path opposing that of the successive track area. In addition, the resistor tracks of the PTC resistors in each resistor branch are arranged opposite one another in such a way that partial currents flow through directly opposing track areas of the two resistor branches in directly opposite directions. Electrical terminals of the PTC resistors are connected such that the partial currents flowing through the track areas of PTC resistors in directly adjacent planes flow in directly opposite directions.

While this invention has been illustrated and described in accordance with a preferred embodiment, it is recognized that variations and changes may be made without departing from the invention as set forth in the claims.

What is claimed is:

1. An overcurrent limiter comprising:

a) at least two meandering resistor branches connected in parallel with each other;

b) each of the resistor branches containing at least one PTC resistor;

c) the PTC resistors in each of the two meandering resistor branches each having at least one resistor track with plural track areas, each track area adjacent a successive track area establishing a current flow path opposing that of the successive track area;

d) the resistor tracks of each resistor branch being separated by an electrical insulator from each other and arranged opposite one another in such a way that partial currents flow through directly opposing track areas of the two resistor branches in directly opposite directions;

e) said opposing track areas having a predefinable, consistent distance from one another in a range from 0.01 mm to 1 mm;

f) at least two of said opposing resistor tracks having a meandering, symmetrical design and including inductively uncompensated marginal areas;

g) one compensating resistor being connected electrically in series with each of said resistor tracks;

h) the compensating resistor having one left and one right compensation branch;

i) the left and right compensation branches being arranged in electrically insulated fashion and at a predefinable distance from inductively uncompensated marginal areas of the resistor tracks; and j) the left and right compensation branches of the compensating resistor being matched in shape with the inductively uncompensated marginal areas of the resistor tracks.

2. The overcurrent limiter as claimed in claim 1, wherein each of the resistor tracks are embodied as at least one of:

a) a Chaperon winding;

b) a bifilar winding;

c) a meandering shape with an inductance-compensating return conductor and closely adjoining electrical terminals on its ends; and d) a meandering shape with a return conductor and with spaced-apart electrical terminals at its ends.

3. The overcurrent limiter as claimed in claim 1, comprising:

a cooling body, wherein each of said resistor tracks of said two resistor branches are arranged in grooves of said cooling body.

4. The overcurrent limiter as claimed in claim 1, wherein the resistor tracks are formed of a porous metal foam.

5. The overcurrent limiter as claimed in claim 1, wherein the resistor tracks are formed of at least one of a metal braid and a metal fabric.

6. The overcurrent limiter as claimed in claim 1, wherein the resistor tracks are joined together by electrical contact bridges.

7. An overcurrent limiter comprising:

a) at least two resistor branches connected in parallel with each other;

b) each of the resistor branches containing at least one PTC resistor;

c) the PTC resistors in each of at least the two resistor branches d) each having resistor tracks which are arranged in a plane;

e) the planes associated with the PTC resistors being parallel to each other;

f) the resistor tracks of the PTC resistor of each resistor branch having a predefinable, consistent distance in a range from 0.01 mm to 1 mm from the resistor tracks of the other PTC resistors;

g) the resistor tracks of the PTC resistor of each resistor branch being partially electrically insulated from the resistor tracks of the other PTC resistors;

h) the resistor tracks of each resistor branch having a meandering design of plural track areas, each track area adjacent a successive track area establishing a current flow path opposing that of the successive track area;

i) the arrangement of the resistor tracks of a PTC resistor being a laterally reversed arrangement of the resistor tracks of a PTC resistor in an adjacent plane;

j) resistor tracks of a PTC resistor having track areas directly adjacent to identical track areas of resistor tracks in an adjacent plane, with partial currents flowing through said adjacent track areas in directly opposite directions;

f) one compensating resistor being connected electrically in series with each of said PTC resistors;

g) said compensating resistor having one left and one right compensation branch;

h) said left and right compensation branches being arranged in electrically insulated fashion in a plane parallel to and at a predefined distance from the planes associated with the PTC resistors; and i) said left and right compensation branches being shaped to lead along track areas of the resistor tracks, where said track areas do not have corresponding track areas in an adjacent plane with a current flowing in the opposite direction.

8. The overcurrent limiter as claimed in claim 7, comprising:

a cooling body, wherein said resistor tracks of said resistor branches are arranged in grooves of said cooling body.

9. The overcurrent limiter of claim 7, wherein the resistor tracks are formed of at least one of a metal braid and a metal fabric.

10. The overcurrent limiter of claim 7, wherein the resistor tracks are joined together by electrical contact bridges.

* * * * *